United States Patent
Bae et al.

[19]

[11] Patent Number: 5,989,788

[45] Date of Patent: *Nov. 23, 1999

[54] METHOD FOR FORMING RESIST PATTERNS HAVING TWO PHOTORESIST LAYERS AND AN INTERMEDIATE LAYER

[75] Inventors: Sang Man Bae; Ki Ho Baik, both of Kyoungki-do, Rep. of Korea

[73] Assignee: Hyundai Electronics Industries Co., Ltd., Kyoungki-do, Rep. of Korea

[ * ] Notice: This patent is subject to a terminal disclaimer.

[21] Appl. No.: 08/966,821

[22] Filed: Nov. 10, 1997

Related U.S. Application Data

[63] Continuation of application No. 08/501,947, Jul. 13, 1995, Pat. No. 5,830,624.

[30] Foreign Application Priority Data

Jul. 14, 1994 [KR] Rep. of Korea ...................... 94-16978
Jul. 14, 1994 [KR] Rep. of Korea ...................... 94-16979

[51] Int. Cl.⁶ ..................................................... G03C 5/00
[52] U.S. Cl. ........................ 430/326; 430/324; 430/330; 430/394
[58] Field of Search .................................. 430/325, 326, 430/394, 330, 510, 513, 324, 323, 312, 314

[56] References Cited

U.S. PATENT DOCUMENTS

| | | | |
|---|---|---|---|
| 3,482,977 | 12/1969 | Baker | 430/317 |
| 3,506,441 | 4/1970 | Gottfried | 430/312 |
| 3,518,084 | 6/1970 | Barson et al. | 430/312 |
| 4,022,927 | 5/1977 | Pfeiffer et al. | 430/5 |

(List continued on next page.)

FOREIGN PATENT DOCUMENTS

| | | | |
|---|---|---|---|
| 0 455 032 A2 | 11/1991 | European Pat. Off. | H01L 21/90 |
| 42 31 312 A1 | 3/1994 | Germany | G03F 7/09 |
| 44 40 230 | 5/1995 | Germany | G03F 7/00 |
| 44 43 957 | 6/1995 | Germany | H01L 21/308 |
| 63-170 917 | 7/1988 | Japan | H01L 21/30 |
| 1 422 080 | 1/1976 | United Kingdom | G03C 5/00 |
| 1 450 509 | 9/1976 | United Kingdom | H01L 21/02 |
| 1 478 333 | 6/1977 | United Kingdom | G03C 1/52 |
| 1 577 492 | 10/1980 | United Kingdom | G03C 1/68 |
| WO 95/18991 | 7/1995 | WIPO | G03F 7/00 |

OTHER PUBLICATIONS

Kresig, D., "Neue Trends in der Entwicklung, Answendung und Verarbeitung organischer Photoresiste", *J. Inf. Rec. Mater*, vol. 15, No. 2, pp. 75–87 (1987).

Horng, C.T., et al., "Superimposition of Photoresist Patterns", *IBM Technical Disclosure Bulletin*, vol. 26, No. 3B, p. 172 (Aug. 1983).

Bassous, E. et al., "A Three–Letter Resist System for Deep U.V. and RIE Microlithography on Nonplanar Surfaces", *J. Electrochem. Soc., Solid–State Science and Technology*, vol. 130, No. 2, pp. 478–484 (Feb. 1983).

Lin, Yi–Ching, et al., "Use of antireflective coating in bilayer resist process", *J. Vac. Sci. Technol, B*, vol. 1, No. 4, pp. 1215–1218 (Oct.–Dec. 1983).

Primary Examiner—Bernard Codd
Attorney, Agent, or Firm—Thelen Reid & Priest, LLP

[57] ABSTRACT

A method for forming resist patterns having two photoresist layers and an intermediate layer involves coating a primary photoresist film having a small thickness over an under layer, and exposing the primary photoresist film to light using a mask. Then, the primary photoresist film is developed, thereby forming a primary photoresist film pattern. An intermediate layer is formed over the entire exposed surface of a resulting structure, the intermediate layer being made of a spin on glass or plasma enhancement oxide. A secondary photoresist film is coated over the intermediate layer. The secondary photoresist film is exposed to light using the same mask as used for the primary photoresist film, and is developed to form a secondary photoresist pattern. A portion of the intermediate layer exposed through the secondary photoresist pattern is etched, forming a secondary photoresist pattern completely overlapping with the primary photoresist pattern so that the resulting resist pattern has a vertical profile.

2 Claims, 4 Drawing Sheets

U.S. PATENT DOCUMENTS

| | | | |
|---|---|---|---|
| 4,612,275 | 9/1986 | Gregor | 430/296 |
| 4,859,573 | 8/1989 | Maheras et al. | 430/326 |
| 4,885,262 | 12/1989 | Ting et al. | 438/669 |
| 5,024,919 | 6/1991 | Yamauchi | 430/312 |
| 5,117,276 | 5/1992 | Thomas et al. | 357/71 |
| 5,143,820 | 9/1992 | Kotecha et al. | 430/314 |
| 5,275,913 | 1/1994 | Lin | 430/252 |
| 5,304,453 | 4/1994 | Lin | 430/252 |
| 5,830,624 | 11/1998 | Bae et al. | 430/323 |

METHOD FOR FORMING RESIST PATTERNS HAVING TWO PHOTORESIST LAYERS AND AN INTERMEDIATE LAYER

This is a continuation of application Ser. No. 08/501,947, filed Jul. 13, 1995, now U.S. Pat. No. 5,830,624, issued Nov. 3, 1998.

BACKGROUND OF THE INVENTION

1. Field of the Invention

The present invention relates to a method for forming resist patterns in the fabrication of semiconductor devices, and more particularly, to a method for forming resist patterns having a vertical profile.

2. Description of the Prior Art

Where a resist pattern is formed using conventional single layer resist and tri-level resist methods, a notching occurs at side walls of the resist pattern due to light reflected by a substrate disposed under the resist pattern or an under layer. Such a notching results in a problem that the resist pattern has no vertical profile.

FIG. 1 illustrates the exposure of a resist film to light in accordance with a conventional method. As shown in FIG. 1, a photoresist film 34 is coated over a substrate or an under layer 35. As the photoresist film 34 is exposed to light 31 through a mask 32, the light transmitting the photoresist film 34 is reflected from the surface of the substrate 35 and then reflected again from the upper surface of the photoresist film 34. As a result, non-exposure portions of the photoresist film 34 are undesirably exposed to light 36 irregularly reflected as mentioned above. This results in a notching phenomenon that the side walls of a photoresist film pattern are partially removed.

Where a resist pattern is formed by coating a photoresist film over a substrate formed with another pattern and then patterning the photoresist film by use of exposure and development processes, a notching may occur due to the topology of the under pattern. In other words, the photoresist film pattern is partially removed at its side walls.

Generally, photoresist films used to obtain micropatterns are resist films having a low viscosity and a high sensitivity. Due to these properties, it is difficult for such photoresist films to have a large thickness. It is impossible to use photoresist films having a small thickness as masks for patterning metal layers. In order to increase the photoresist film thickness, a double resist coating method has been proposed.

FIG. 6 illustrates a conventional double resist coating method. In accordance with this method, a primary photoresist film 43 is formed over a silicon substrate 44 by coating a liquid phase photoresist material 46 through a nozzle 41 onto the silicon substrate 44 mounted on the shaft 45 of a spinner while rotating the silicon substrate 44, as shown in FIG. 6. A secondary photoresist film 42 is coated cover the primary photoresist film 43.

During the coating of the secondary photoresist film 42, the upper surface of the primary photoresist film 43 is dissolved by a solvent contained in the material for the secondary photoresist film 42, thereby causing an interface between the primary photoresist film 43 and the secondary photoresist film 42 to be poor. As a result, the primary and secondary photoresist films have a degraded uniformity in thickness. As the photoresist film thickness becomes larger, the resolution of the resulting resist pattern is degraded. This is because the undesirably large thickness of the photoresist film results in limiting the depth of focus which causes the process margin of the reduced exposure equipment to decline.

SUMMARY OF THE INVENTION

Therefore, an object of the invention is to solve the problem encountered in the conventional method illustrated in FIG. 1 and to provide a method for forming a resist pattern having a vertical profile by absorbing light reflected from the surface of an under substrate to form a thin primary photoresist pattern.

Another object of the invention is to solve the problem encountered in the conventional method illustrated in FIG. 6 and to provide a method for forming a resist pattern having a good profile by coating a primary photoresist film, exposing the primary photoresist film to light, coating an anti-reflective layer over the primary photoresist film, coating a secondary photoresist film over the anti-reflective layer, exposing the secondary photoresist film to light, and developing the resulting structure to form primary and secondary resist patterns.

In accordance with an aspect, the present invention provides a method for forming a resist pattern, comprising the steps of: coating a primary photoresist film having a small thickness over an under layer; exposing the primary photoresist film to light using a mask and then developing the primary photoresist film, thereby forming a primary photoresist pattern; forming an intermediate layer over the entire exposed surface of the resulting structure; coating a secondary photoresist film over the intermediate layer, exposing the secondary photoresist film to light using the same mask as used for the primary photoresist film and then developing the secondary photoresist film, thereby forming a secondary photoresist pattern; and etching a portion of the intermediate layer exposed through the secondary photoresist pattern, thereby forming a secondary photoresist pattern completely overlapping with the primary photoresist pattern so that the resulting resist pattern has a vertical profile.

In accordance with another aspect, the present invention provides a method for forming a resist pattern, comprising the steps of: coating a primary photoresist film over an under layer, exposing the primary photoresist film to light using a mask, thereby defining a light-exposed region in the primary photoresist film; forming an anti-reflective layer having a small thickness over the primary photoresist film; coating a secondary photoresist film over the anti-reflective layer, and exposing the secondary photoresist film to light using the same mask as used for the primary photoresist film, thereby defining a light-exposed region in the secondary photoresist film; and developing the resulting structure, thereby removing portions of the primary and secondary photoresist films and anti-reflective layer respectively corresponding to the light-exposed region so that the resulting resist pattern has a vertical profile.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 2 to 5 illustrate the sequential steps involved in a method for forming a resist pattern in accordance with a first embodiment of the present invention, respectively.

Figure 1:
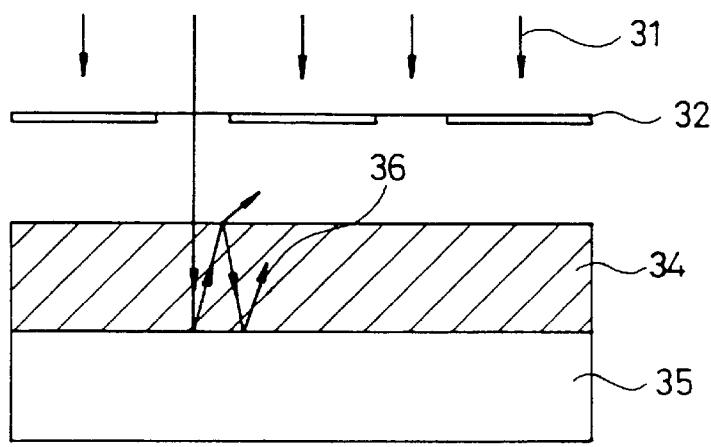
FIG. 1 is a sectional view illustrating the exposure of a resist film to light in accordance with a conventional method.
Figure 2:
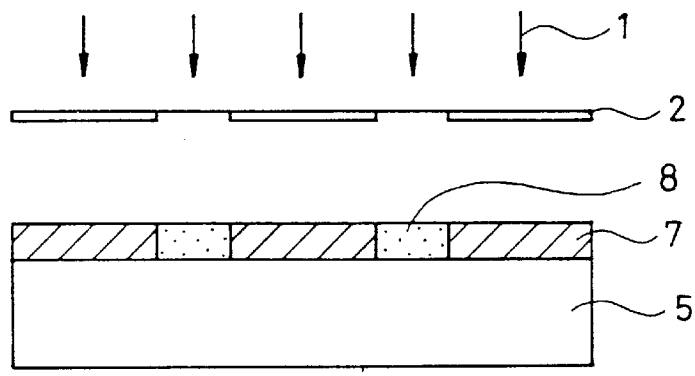
FIGS. 2 to 5 are sectional views respectively illustrating the sequential steps involved in a method for forming a resist pattern in accordance with a first embodiment of the present invention.

In accordance with this method, a thin primary photoresist film 7 is coated over a substrate 5, as shown in FIG. 2. The primary photoresist film 7 is then exposed to light using a mask 2, thereby forming a light-exposed region 8.

The primary photoresist film 7 has a small thickness of not more than 1,000 Å to obtain an improvement in the depth of focus. Accordingly, it is possible to obtain an improvement in the resolution of a resist pattern even when small exposure energy is used. However, it is difficult to use the primary photoresist film 7 having such a small thickness as a satisfactory etch mask for the step of etching an under layer disposed beneath the primary photoresist film.

Figure 3:
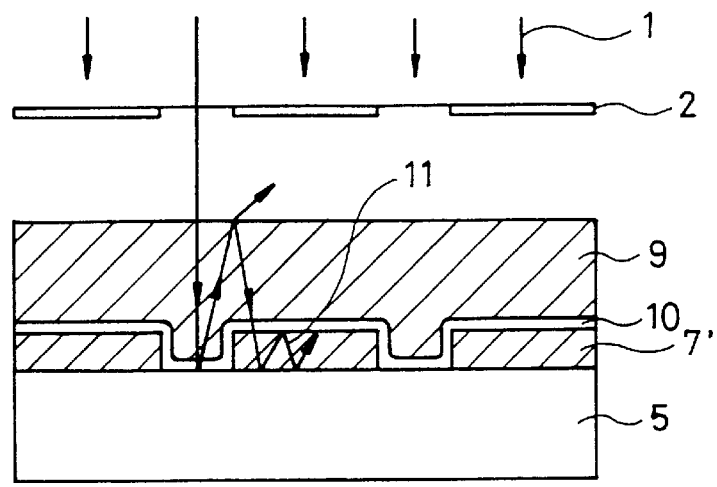

Thereafter, the primary photoresist film 7 is partially removed at its portion corresponding to the light-exposed region 8 using a development process, thereby forming a primary photoresist pattern 7', as shown in FIG. 3. A hard baking is then carried out at a temperature ranging from 150° C. to 300° C. to cure the primary photoresist pattern 7'. Over the resulting structure, an intermediate layer 10 is deposited to a small thickness ranging, for example, from 500 Å to 2,000 Å. The intermediate layer 10 is adapted to prevent the primary photoresist pattern 7' from being damaged upon coating a secondary photoresist film during subsequent steps. The intermediate layer 10 is made of a spin on glass (SOG) or a plasma enhanced oxide. The intermediate layer 10 may also be made of anti-reflective coating material which is not any metallic material, but a material having a high transparency such as polyvinyl alcohol. A secondary photoresist film 9 is then coated over the intermediate layer 10. Using the mask 2 used at the step of FIG. 2, the secondary photoresist film 9 is then exposed to light 1.

With such a structure, the effect of reflective light 11 resulted from the exposure light is minimized to achieve an improvement in contrast. In other words, the light transmitting the secondary photoresist film 9 is reflected from the surface of the substrate 10 and then reflected again from the surface of the secondary photoresist film 9. The reflected light is then absorbed into the primary photoresist pattern 7', thereby minimizing the problem that the secondary photoresist film 9 is exposed at its non-exposure portion to the reflected light.

The thickness of the secondary photoresist film 9 is determined by the thickness of the under layer to be patterned, namely, the layer disposed beneath the secondary photoresist film 9.

Figure 4:
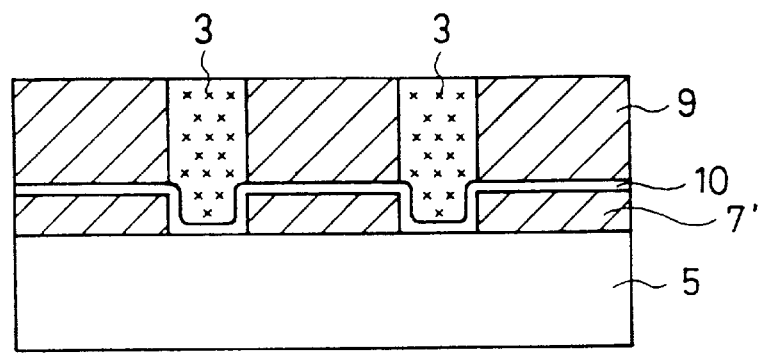

FIG. 4 shows a light-exposed region 3 defined in the secondary photoresist film 9 during the light exposure step.

Figure 5:
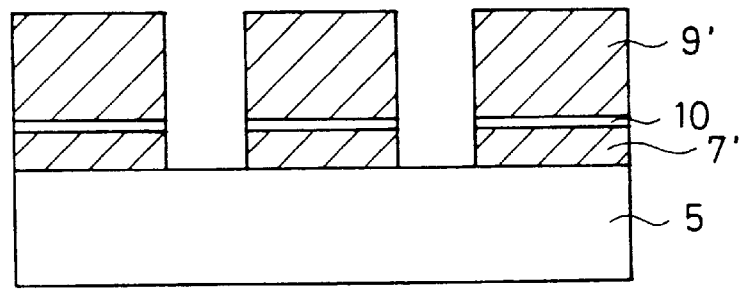
Figure 6:
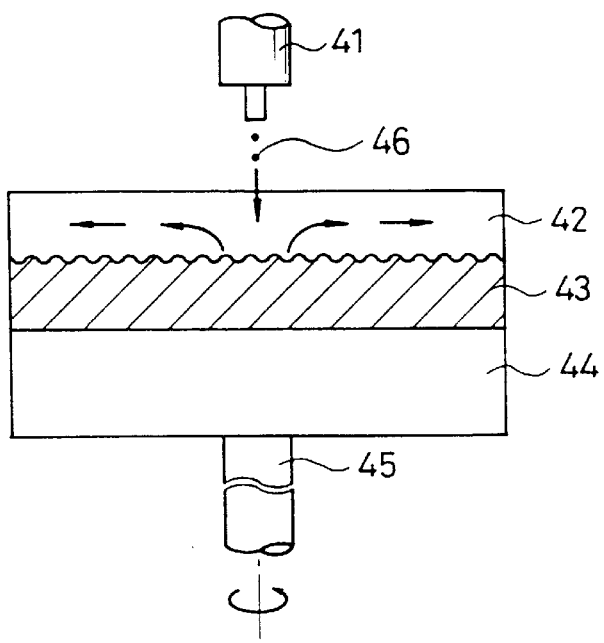
FIG. 6 is a sectional view illustrating a conventional double resist coating method.

The resulting structure is then developed to remove the light-exposed portion 3 of the secondary photoresist film 9, thereby forming a secondary photoresist-pattern 9', as shown in FIG. 5. Thereafter, the intermediate layer 10 is partially etched at its portion exposed through the secondary photoresist pattern 9'. As a result, a resist pattern having a vertical profile is formed.

On the other hand, FIGS. 7 to 10 illustrate the sequential steps involved in a method for forming a resist pattern in accordance with a second embodiment of the present invention, respectively.

Figure 7:
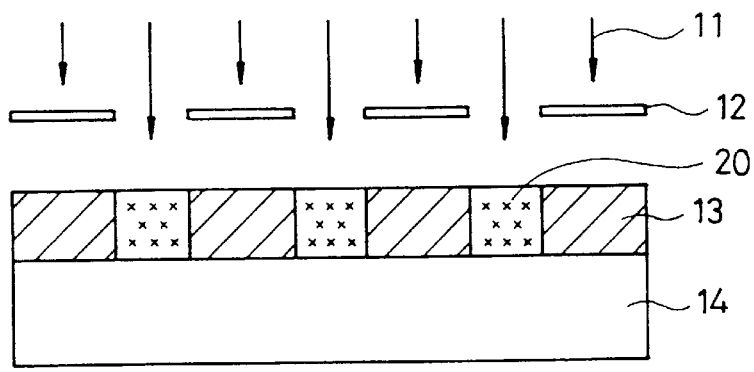
FIGS. 7 to 10 are sectional views respectively illustrating the sequential steps involved in a method for forming a resist pattern in accordance with a second embodiment of the present invention.

In accordance with this method, a primary photoresist film 13 is coated to a thickness of not more than 10,000 Å over a silicon substrate 14, as shown in FIG. 7. The primary photoresist film 13 is then exposed to light using a mask 12, thereby forming a light-exposed region 20.

Figure 8:
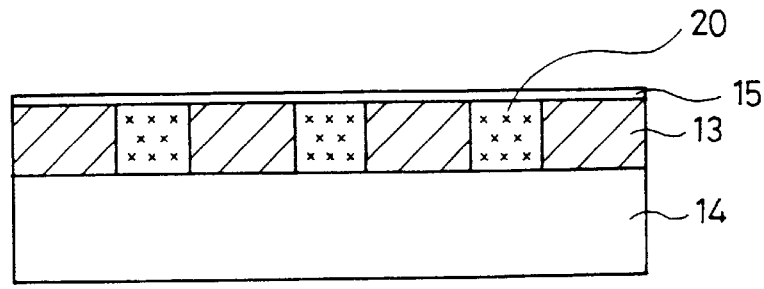

Over the resulting structure, an anti-reflective layer is formed to a thickness of, for example, several hundreds angstroms to several ten hundreds angstroms to protect the primary photoresist film 13 and the light-exposed region 20, as shown in FIG. 8. The anti-reflective layer 15 is made of polyimide or other anti-reflective coating (ARC) material insoluble in a solvent contained in the material of the primary photoresist film 13 and exhibiting a high light absorption. The ARC is soluble in $H_2O$ contained in a developer.

Figure 9:
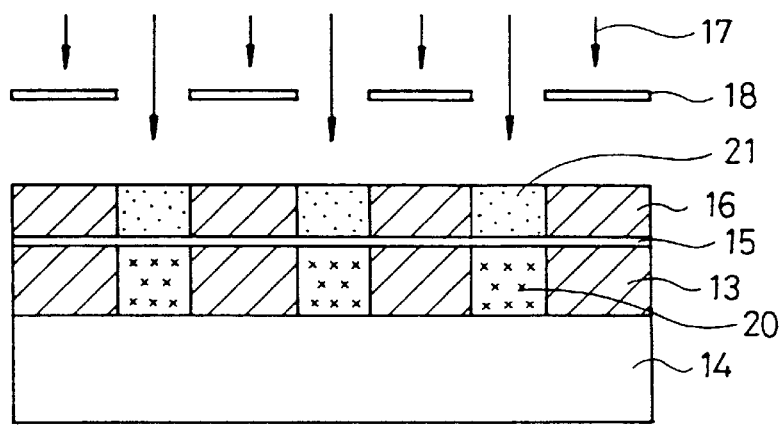
Figure 10:
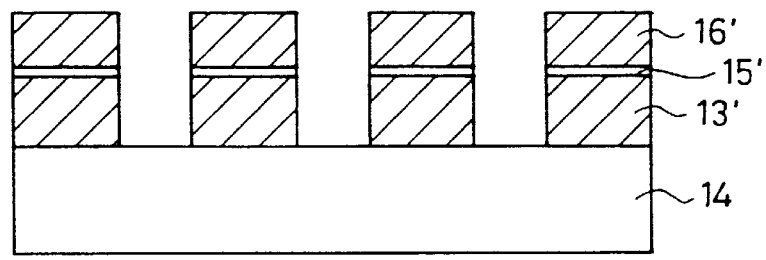

A secondary photoresist film 16 is then lightly coated over the non-reflective layer 15, as shown in FIG. 9. Using the mask 18 used at the step of FIG. 7, the secondary photoresist film 16 is then exposed to light 17, thereby defining a light-exposed region 21.

The resulting structure is then developed to remove the light-exposed portion 21 of the secondary photoresist film 16, the portions of the anti-reflective layer 15 and primary photoresist film 13 respectively disposed beneath the light-exposed portion 21. As a result, a secondary photoresist pattern 16', a non-reflective layer pattern 15' and a primary photoresist pattern 13' are formed.

After the formation of the patterns, the anti-reflective layer 15 is removed using a developer used at the development step.

The method of the second embodiment involves coating the primary photoresist film having a small thickness, exposing the primary photoresist film to light, coating the secondary photoresist film over the patterned primary photoresist film and exposing the secondary photoresist film to light on the basis of the fact that a thin resist film can provide a sufficient process margin for the depth of focus upon being exposed to light. Therefore, this method can obtain a good profile of the resist pattern in spite of the fact that the resist pattern has a large thickness.

Figure 11:
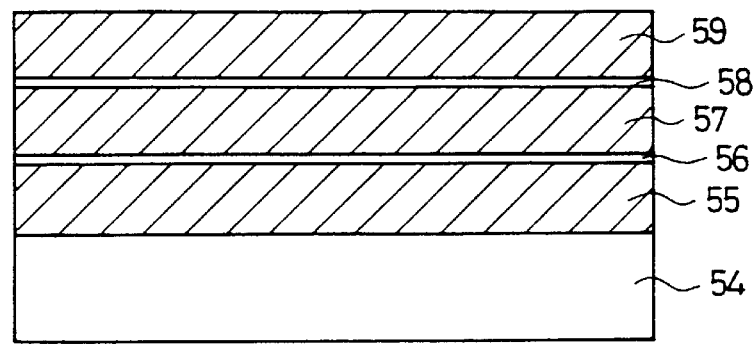
FIG. 11 is a sectional view-illustrating a multi-layer resist structure formed in accordance with a third embodiment of the present invention.

FIG. 11 illustrates a multi-layer resist structure formed in accordance with a third embodiment of the present invention.

AS shown in FIG. 11, the multi-layer resist structure includes a primary photoresist film 55, a primary anti-reflective film 56, a secondary photoresist film 57, a secondary anti-reflective film 58 and a third photoresist film 59 sequentially formed over a substrate 54. The multi-layer resist film has a thickness of 7 to 8 μm. The photoresist films are exposed to light using the same mask in a manner as described in conjunction with the second embodiment. Accordingly, the resulting resist pattern has a vertical profile.

As apparent from the above description, the first embodiment of the present invention involves forming an intermediate layer over a primary photoresist pattern and coating a secondary photoresist film over the intermediate layer. The primary photoresist pattern absorbs light irregularly reflected upon exposing the secondary photoresist film to light, thereby minimizing a notching phenomenon occurring at a pattern of the secondary photoresist film.

Also, the second embodiment of the present invention involves a double resist coating, namely, coating of primary and secondary photoresist films. As the thickness of the resulting resist structure is increased by virtue of the double resist coating, it is possible to form a resist pattern having a good profile.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a resist pattern, comprising:

coating a primary photoresist film over an under layer to a thickness of not more than 1000 Å so as to obtain an improvement in a depth of focus;

exposing the primary photoresist film to light using a mask, and then developing the primary photoresist film, and removing a portion of the primary photoresist film corresponding to a light-exposed region to form a primary photoresist pattern;

forming an intermediate layer made of spin on glass or a plasma enhanced oxide and having a thickness of 500 to 2000 Å over the entire exposed surface of the resulting structure which includes the primary photoresist pattern to prevent the primary photoresist pattern from being damaged upon coating a secondary photoresist film;

coating the secondary photoresist film over the intermediate layer and exposing the secondary photoresist film to light using the same mask as used for the primary photoresist film and then developing the secondary photoresist film, and removing a portion of the secondary photoresist film corresponding to the light-exposed region to form a second photoresist pattern; and etching a portion of the intermediate layer exposed through the secondary photoresist pattern using the secondary photoresist pattern as a mask to completely overlap the secondary photoresist pattern with the primary photoresist pattern so that the resulting resist pattern has a vertical profile.

2. A method in accordance with claim 1, further comprising:

baking the primary photoresist pattern at a temperature ranging from 150° C. to 300° C. after the step of forming the primary photoresist pattern.

* * * * *